(12) United States Patent  
Anikitchev

(10) Patent No.: US 7,355,800 B2  
(45) Date of Patent: Apr. 8, 2008

(54) APPARATUS FOR PROJECTING A LINE OF LIGHT FROM A DIODE-LASER ARRAY

(75) Inventor: Serguei G. Anikitchev, Belmont, CA (US)

(73) Assignee: Coherent, Inc., Santa Clara, CA (US)

(*) Notice: Subject to any disclaimer, the term of this patent is extended or adjusted under 35 U.S.C. 154(b) by 446 days.

(21) Appl. No.: 11/052,240

(22) Filed: Feb. 7, 2005

(65) Prior Publication Data

US 2006/0176912 A1 Aug. 10, 2006

(51) Int. Cl.  
G02B 27/10 (2006.01)  
G02B 13/10 (2006.01)  
G02B 3/06 (2006.01)

(52) U.S. Cl. ........................ 359/710; 359/618

(58) Field of Classification Search ........ 359/618–619, 359/708, 710; 362/551, 553  
See application file for complete search history.

(56) References Cited

U.S. PATENT DOCUMENTS

| 3,379,832 | A | 4/1968 | Judin ........................ 178/7.6 |
| 4,744,615 | A | 5/1988 | Fan et al. .................. 350/96.1 |
| 5,517,359 | A | 5/1996 | Gelbart ........................ 359/623 |
| 5,889,567 | A | 3/1999 | Swanson et al. .............. 349/62 |
| 6,005,722 | A | 12/1999 | Butterworth et al. ....... 359/712 |
| 6,384,981 | B1 | 5/2002 | Hauschild .................... 359/622 |
| 6,494,371 | B1 | 12/2002 | Rekow et al. .............. 235/454 |
| 6,726,333 | B2 | 4/2004 | Huibers et al. ............... 353/84 |
| 6,773,142 | B2 | 8/2004 | Rekow ........................ 362/259 |
| 2002/0058931 | A1 | 5/2002 | Parker et al. .................. 606/16 |
| 2003/0016450 | A1 | 1/2003 | Bluemel et al. ............. 359/618 |
| 2003/0039036 | A1 | 2/2003 | Kruschwitz et al. ........ 359/707 |
| 2004/0080938 | A1 | 4/2004 | Holman et al. ............. 362/231 |
| 2004/0134987 | A1 | 7/2004 | Check et al. .......... 235/462.14 |
| 2004/0252281 | A1 | 12/2004 | Fischer et al. ................. 353/53 |
| 2005/0175285 | A1* | 8/2005 | Reynolds et al. ............. 385/39 |

FOREIGN PATENT DOCUMENTS

| DE | 103 27 735 A1 | 6/2003 |
| EP | 1 457 806 A2 | 9/2004 |
| GB | 1331709 A1 * | 7/2003 |

OTHER PUBLICATIONS

In re U.S. Appl. No. 10/667,675, filed Sep. 22, 2003, entitled "Apparatus for Projecting a Line of Light from a Diode-Laser Array," by Serguei G. Anikitchev et al., 25 pages in length.

* cited by examiner

Primary Examiner—Alicia M Harrington  
(74) Attorney, Agent, or Firm—Stallman & Pollock LLP

(57) ABSTRACT

A line-of-light projecting module is illuminated by a diode-laser bar and includes light-pipe for homogenizing light from the diode-laser bar in the slow-axis. A shaping optics assembly directs the light emitted by the diode-laser bar into the entrance end of the light-pipe as a diverging beam in the slow-axis and as a collimated beam in the fast-axis. The light propagates through the light-pipe unguided in the fast axis. The light is guided by the light-pipe in the slow-axis, and homogenized in the slow-axis by making multiple reflections from walls of the light-pipe. An anamorphic projection optics assembly projects the light from the exit end of the light-pipe and focuses the light to form the line-of-light.

27 Claims, 7 Drawing Sheets

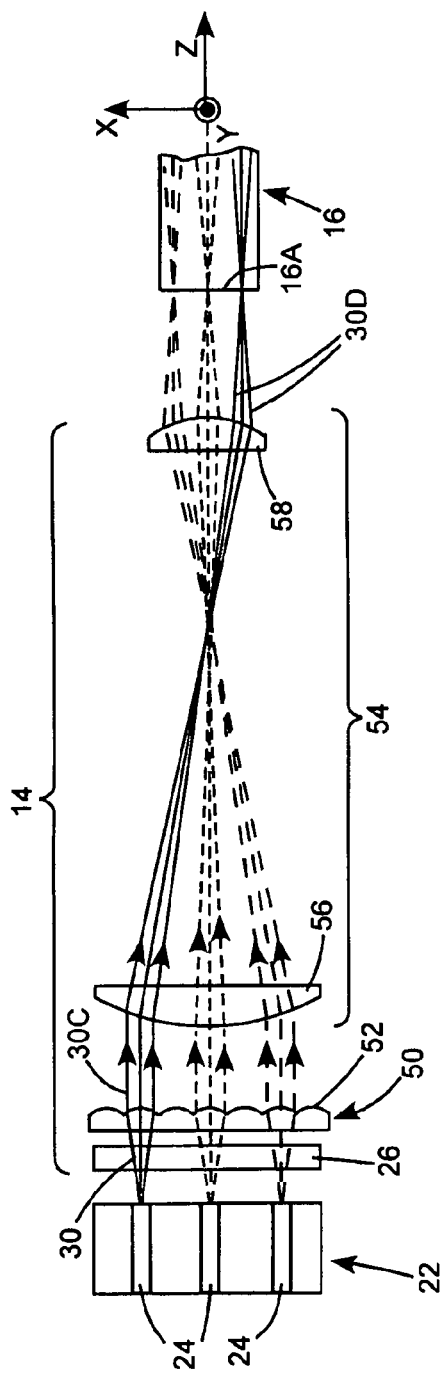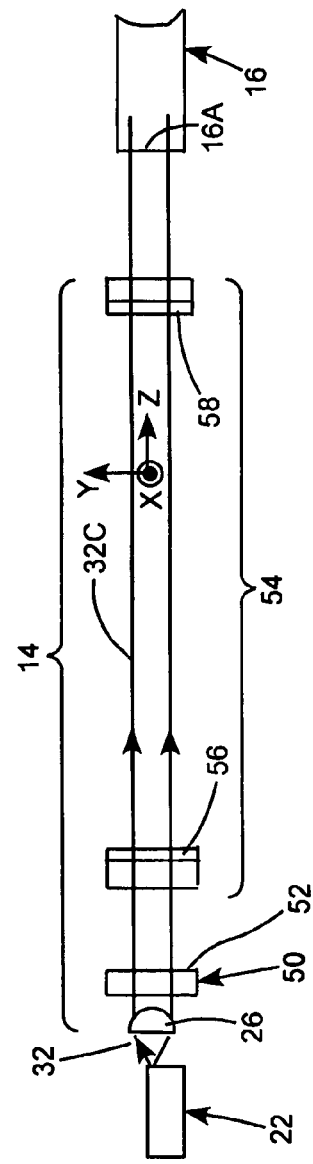
FIG. 5A
FIG. 5B

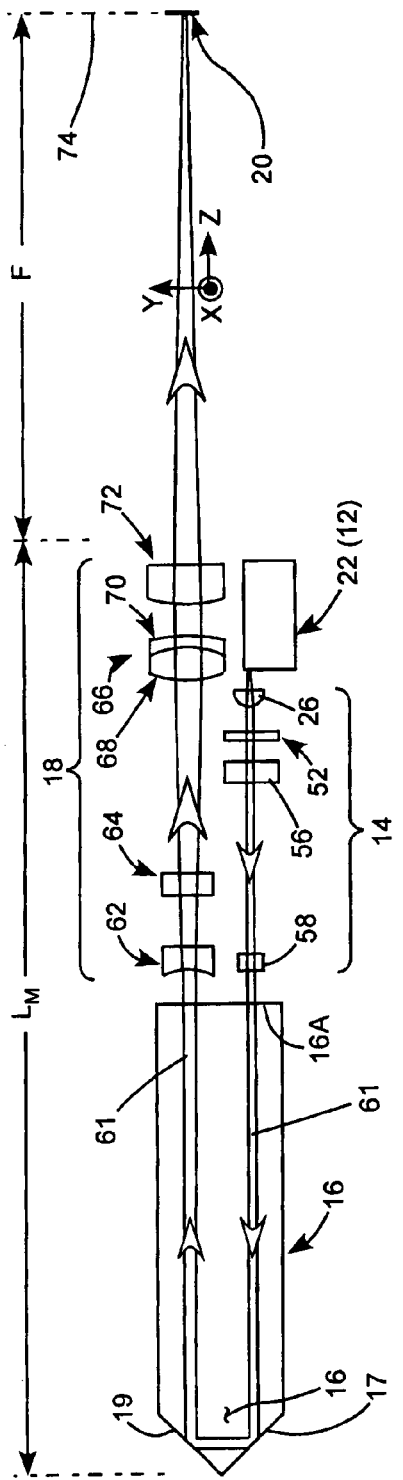
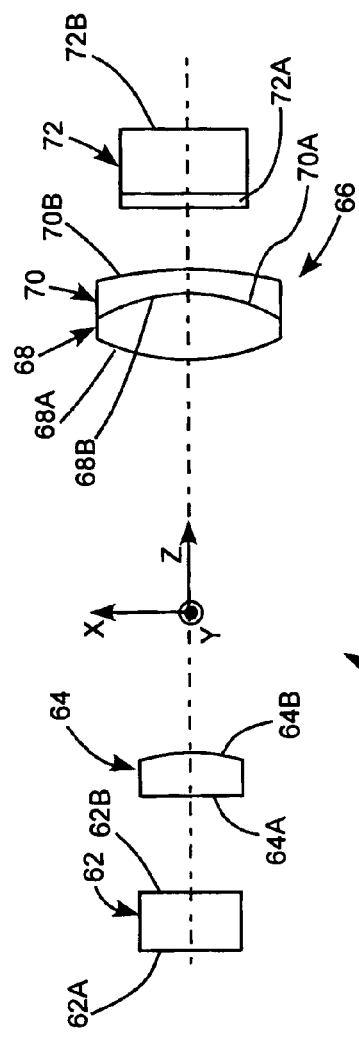
FIG. 6
FIG. 6A

APPARATUS FOR PROJECTING A LINE OF LIGHT FROM A DIODE-LASER ARRAY

TECHNICAL FIELD OF THE INVENTION

The present invention relates in general to apparatus for illuminating spatial light modulators in printers and scanners, optical processing of semiconductor wafers, and the like. The invention relates in particular to apparatus for providing such illumination by projecting light from a diode-laser bar or a stack thereof to form of an elongated line of the light.

DISCUSSION OF BACKGROUND ART

In a line of light projected onto a linear spatial light modulator in an optical printing apparatus, onto a wafer in semiconductor process, or the like, it is usually preferred that light intensity along the line is as uniform as possible. This is because it is desirable that variations in uniformity of light projected from the spatial light modulator, for example, to a screen or a recording medium or to the wafer, are only the wanted variations representing information content of the projected light.

A diode-laser bar or a stack of such diode-laser bars is preferred as a light source in line-of light projecting apparatus because it is both compact and electrically efficient. A diode laser bar has a length of about 10 millimeters (mm) and a width of about 1.0 mm. The bar includes a plurality of spaced-apart individual diode-lasers (emitters) having a length in the width direction of the bar and a width in the length direction of the bar. The aperture of an emitter has a height (perpendicular to the length and width of the bar) of about 1.0 micrometer (μm). The width of the emitter is usually selected based on some compromise between a required power per emitter (in general, the wider the emitter the higher the power) and the quality of the beam emitted by the emitter (in general the narrower the emitter the higher the quality).

Another consideration in selecting emitter width is a parameter referred to as the fill-factor of a diode-laser bar. This is the fraction of the length of the bar that is occupied by the total width of emitting apertures. As there must be a certain minimum space between emitters, for example, between about 10 μm and 20 μm, clearly, the wider an individual emitter the less are required to occupy the length of the bar, the less is the length of the bar that is occupied by space between emitters, and the higher the possible fill factor. In a high power, for example, about 100 Watts (W) total, diode-laser bar, a common emitter width is about 100 μm. This allows a fill factor as high as 90%.

The height direction of the bar (and emitters) and the width direction of the bar (and emitters) are generally referred to as the fast and slow-axes of the bar (and emitters), respectively. The near-field emitted uniformity of a 100 μm emitter in the slow-axis (width direction) can vary by as much as between about 10% and 30%, here, defined as the difference between the maximum and minimum intensity divided by the maximum intensity. Prior-art line-of-light projectors usually function by projecting the height of the emitters as the height or width of the projected line of light and projecting the width of the emitters as the length of the line of light. It is usual to provide an optical system that sums the light in the width direction of the emitters while homogenizing light in the slow-axis using one or a plurality of slow-axis cylindrical microlenses in some configuration.

Diode-laser-bar-illuminated line-of-light projecting apparatuses functioning generally in this manner, but differing in implementation, are described in U.S. Pat. No. (5,517,359) to Gelbart, U.S. Pat. No. 6,494,371 to Rekow et al., U.S. Pat. No. 6,773,142 to Rekow, and U.S. patent application Ser. No. 10/667,675 filed Sep. 22, 2003, which is assigned to the assignee of the present invention. Each disclosed apparatus has a property that light intensity distribution changes due to failure of an individual emitter are minimized. It is believed, however, that slow-axis light-intensity variation in any one of these apparatus will be about 5% at best. There is a need for a diode-laser-bar-illuminated line-of-light projecting apparatus capable of projecting a line having a slow-axis light intensity variation less than prior-art apparatus while still retaining the insensitivity to failure of an individual emitter.

SUMMARY OF THE INVENTION

In one aspect, a line-of-light projecting apparatus in accordance with the present invention comprises a light-pipe and at least one diode-laser bar for emitting light. Light from the diode-laser bar is emitted in first and second axes perpendicular to each other and perpendicular to the general direction of emission. A first optical arrangement directs the light emitted by the diode-laser bar into the light-pipe. The first optical arrangement and the light-pipe are arranged such that the light propagates through the light-pipe substantially unguided thereby in the first axis, and guided by the light-pipe in the second axis. A second optical arrangement receives light exiting the light-pipe and focuses the light to form the line-of-light.

In another aspect of the invention, the first and second axes are the fast and slow axes of emitters of the diode-laser bar. The first optical arrangement includes a lens having power in the fast-axis only and configured to substantially collimate the light in the fast-axis. The fast-axis dimension of the cross-section is at least sufficient that the light-pipe accepts all of the fast-axis collimated light. The slow-axis dimension of the cross section is preferably only just sufficient that the light-pipe accepts all of the slow-axis light.

In a preferred embodiment of the inventive line-of-light projecting apparatus, the first optical arrangement includes a telecentric telescope having optical power in the slow-axis only and arranged to focus slow-axis emitted light into the first end of the light-pipe. The second optical arrangement is in the form of an anamorphic telescope having different optical power in the fast and slow-axes.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIGS. 5A and 5B are slow-axis and fast-axis views, respectively, schematically illustrating still another example of the shaping optical assembly of FIG. 1 wherein light is first collimated in both the fast and slow-axes then focused into the light-pipe in the slow-axis by two cylindrical lenses forming a telecentric relay.

FIG. 6 is a fast-axis view schematically illustrating one preferred embodiment a line-of-light projecting apparatus in accordance with the present invention including a single diode-laser bar and wherein the shaping optical assembly is in accordance with the example of FIGS. 5A and 5B, and the projection optical assembly is an anamorphic optical assembly functioning as an inverse telephoto lens in the fast-axis, and a conventional positive lens in the slow-axis.

FIG. 6A is a slow-axis view of the projection optical assembly of FIG. 6.

DETAILED DESCRIPTION OF THE INVENTION

Figure 1:
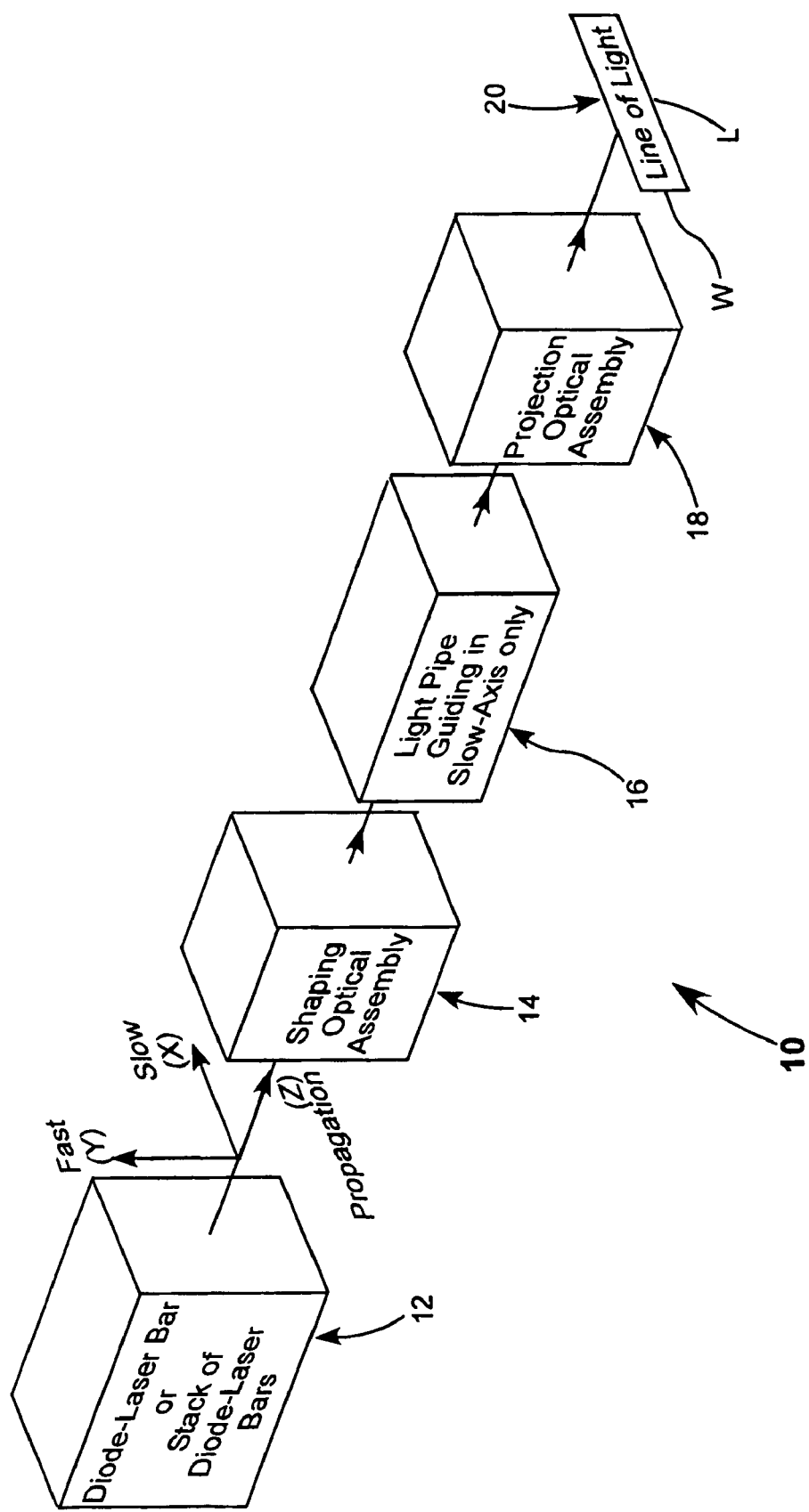
FIG. 1 schematically illustrates in three-dimensional block diagram form a general aspect of a line-of-light projecting apparatus in accordance with the present invention including a diode-laser bar or stack thereof, a light-pipe, a shaping optical assembly for directing light into one end of the light-pipe, and a projection optical assembly for imaging the other end of the light-pipe to form a line of light.

Referring now to the drawings, wherein like components are designated by like reference numerals, FIG. 1 schematically illustrates in three-dimension block diagram form functional elements of a line-of-light projecting apparatus (module) 10 in accordance with the present invention. In module 10, light to be projected is provided by a light source 12 including either a single diode-laser bar or a stack of such diode-laser bars. A diode-laser bar can be characterized as discussed above as having a fast-axis and a slow-axis orthogonal to each other and perpendicular to the general emission direction or propagation axis. In FIG. 1, the fast-axis, the slow-axis and the propagation axis are alternatively designated the Y-axis, the X-axis and the Z-axis, respectively.

Module 10 includes a shaping optics assembly 14 and a light-pipe 16. The shaping optics assembly "shapes" light emitted by the light source such that, cooperative with an appropriate selection of dimensions of the cross-section of light-pipe 16, light in the fast-axis propagates freely through the light-pipe, i.e., without being guided by the light-pipe. Light in the slow-axis enters light-pipe 16 along the Z-axis and at a plurality of angles thereto, undergoes multiple reflections from sidewalls of the light-pipe, and is thereby guided through the light-pipe. Because of this, slow-axis rays from all of the emitters in the diode-laser bar or stack thereof are mixed in the light-pipe, and the intensity distribution in the slow-axis of light leaving the light-pipe tends to be homogenized or uniform along the slow-axis, to an extent dependent, among other factors, on the number of side-wall reflections in the light-pipe. Here, it should be noted that light in the fast-axis has essentially the same (usually about Gaussian) intensity distribution as the light emitted by any individual emitter in the diode-laser bar or stack thereof.

In one form, convenient for manufacture, the light-pipe has a rectangular cross-section. In this form sides of the rectangle are aligned with the fast and slow-axes. However, as the light-pipe is not required to guide in the fast-axis, it is only necessary that the light-pipe have two parallel walls aligned in the plane of the fast-axis and spaced apart in the slow-axis. The light-pipe may be made from a solid transparent material with reflections being total internal reflections (TIR), or may be hollow with reflectively coated or naturally reflective walls. It will be evident from the description provided below that in the cross-section dimensions contemplated, and for reasons of minimizing the light-pipe length, the solid form is preferred, After exiting the light-pipe, slow-axis homogenized light is projected by a projection optical assembly 18 to form an image in the form of a line of light 20. Line of light 20 has a width (or height) W in the fast-axis and a length L in the slow-axis. Line of light 20 preferably has a length between about 5.0 mm and 30.0 mm and a width between about 20.0 µm and 50.0 µm, or expressed more generally, an aspect ratio (L:W) between about 100:1 and 500:1.

Figure 2A:
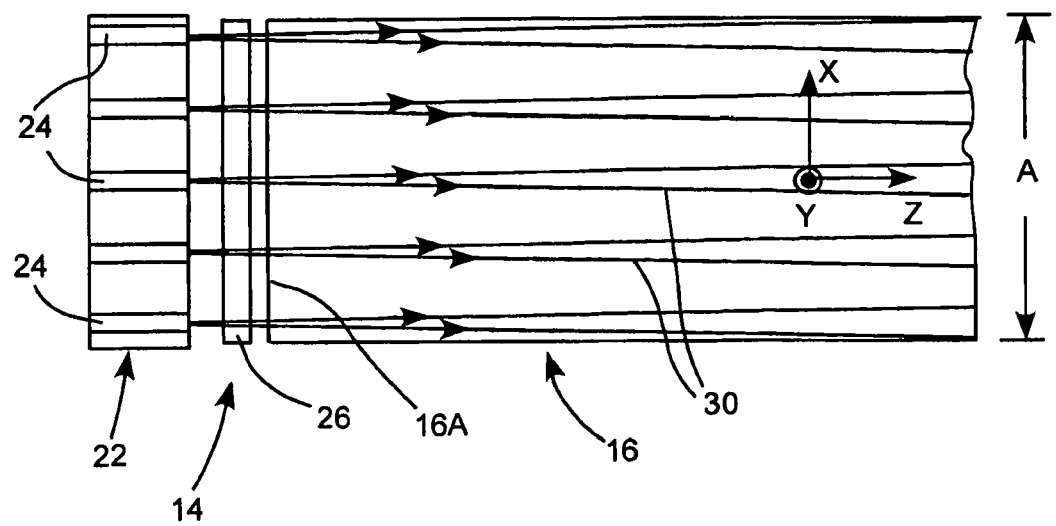
FIGS. 2A and 2B are slow-axis and fast-axis views, respectively, schematically illustrating one example of the shaping optical assembly of FIG. 1 wherein light is collimated in the fast-axis and directly coupled into the light-pipe in the slow-axis by a single cylindrical lens.
Figure 2B:
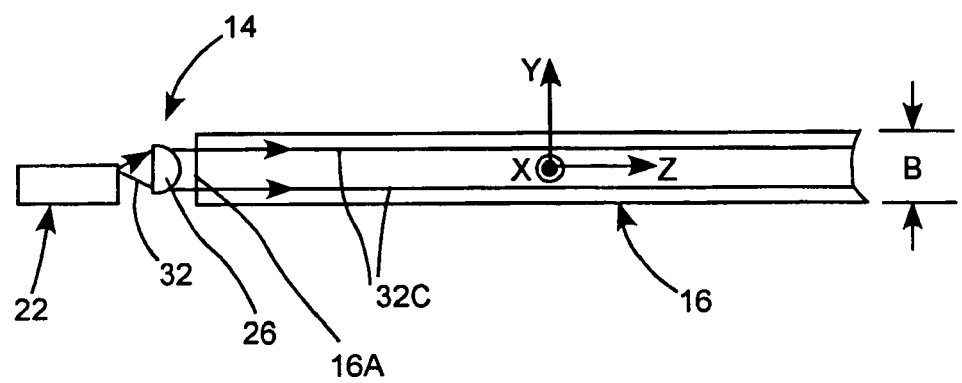

Referring now to FIG. 2A and FIG. 2B, in one preferred example of shaping optical assembly 14, the assembly includes only a single cylindrical lens 26 having positive power optical power in the fast-axis and zero optical power in the slow-axis. The term "cylindrical" is used generally herein to describe optical elements that have optical power in one of two transverse axes. Surface cross-section curvature providing the optical power can be circular, part circular, or a polynomial including second or higher order terms. An assembly of such elements having different optical power in the two orthogonal axes is referred to as anamorphic. Such elements and assemblies are described as having a fast-axis and a slow-axis. These axes are aligned with corresponding axes of the diode-laser bar or bars of light source 12. FIG. 2A is a slow-axis view and FIG. 2B is a fast-axis view.

In the arrangement of FIGS. 2A and 2B, the light source includes a single diode-laser bar 22 having a plurality of emitters 24. Only five emitters 24 are depicted to simplify illustration. Light emitted in the fast-axis by emitters of the diode-laser bar (indicated in FIG. 2B by rays 32) diverges relatively rapidly, for example, at a half angle of about 16° FWHM. Rays 32 are collimated by cylindrical lens 26 to provide fast-axis collimated rays 32C. Light emitted in the slow-axis by emitters of the diode-laser bar (indicated in FIG. 2A by rays 30) diverges relatively slowly, for example, at a half angle of between about 3° and 5° FWHM. As cylindrical lens 26 has zero optical power in the slow-axis, rays 30 are transmitted by lens 22 with the divergence of the rays unchanged.

Light-pipe 16 is arranged with the length thereof aligned with the Z-axis and input end 16A thereof proximate cylindrical lens 12. The light-pipe has a width (slow-axis dimension) A, which is preferably selected to be only just sufficient that the light-pipe can accept slow-axis rays from all emitters in the diode-laser bar. The light-pipe has a height (fast-axis dimension) B at least sufficient that all fast-axis collimated rays 32 can enter the light-pipe and traverse the entire length of the light-pipe without undergoing any reflection from upper and lower walls thereof.

For a beam entering light-pipe 16, the number of reflections N made by the beam, here, slow-axis rays 30, can be approximated by an equation:

$$N = (L * \tan((\alpha/n)))/A \quad (1)$$

Where L and A are the length and width, respectively, of the light-pipe; n is the refractive index of the material the light-pipe; and a is the slow-axis beam divergence of light entering the light-pipe. In this example is equal to the slow-axis divergence of light from the emitters. It is emphasized that equation (1) is not an exact expression and is used herein merely to compare different shaping optics assemblies and light-pipe schemes in accordance with the present invention. The length L required to provide a desired number of reflections No can be approximated by an equation:

$$L > N_0 * n * A/\alpha \quad (2)$$

when α is small, as is usually the case for slow-axis divergence of diode-laser emitters.

Preferably, slow-axis rays 30 should undergo at least three, and more preferably about five, reflections in the light-pipe, in order that slow-axis light exiting the light-pipe is adequately homogenized. In the scheme of FIGS. 2A and 2B, where A is about 10 mm (i.e., about the usual length of a diode-laser bar), α is about 3°, and n is 1.5, light-pipe 16 must have an optical length greater than 1400 mm to provide five reflections and greater than 850 mm to provide three reflections. Such a long light-pipe would probably not be desirable in a commercial line-of-light projecting module.

Figure 3A:
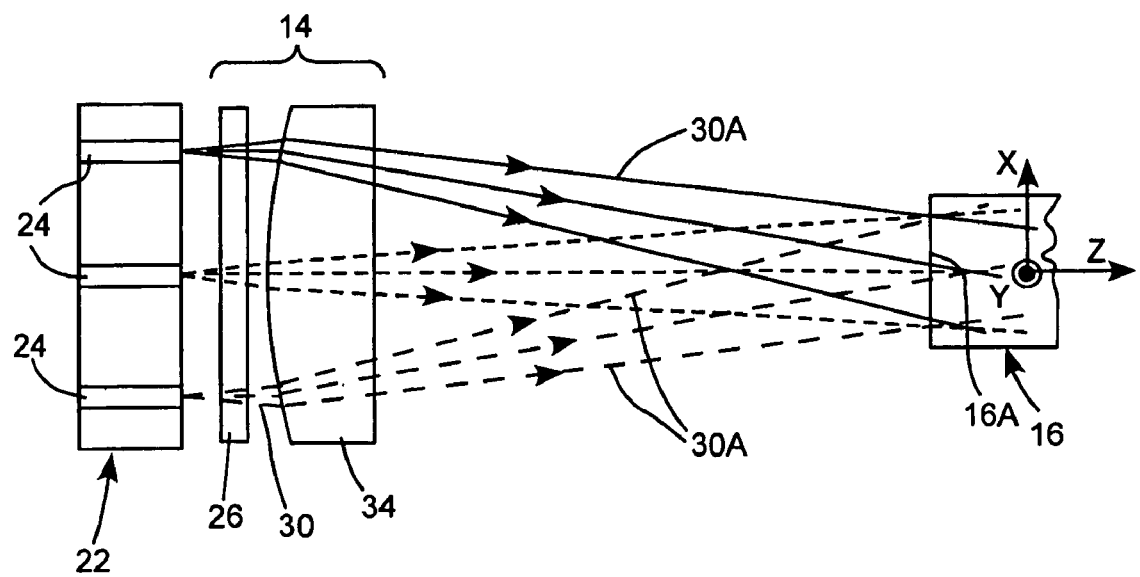
FIGS. 3A and 3B are slow-axis and fast-axis views, respectively, schematically illustrating another example of the shaping optical assembly of FIG. 1 wherein light is collimated in the fast-axis and focused into the light-pipe in the slow-axis.
Figure 3B:
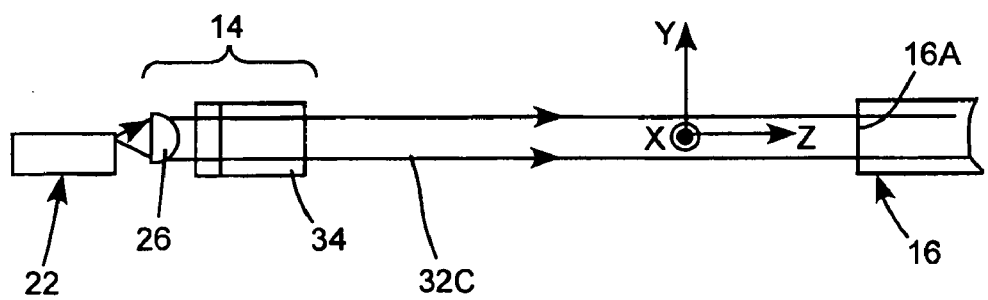

One means of decreasing the optical length of light-pipe 16 necessary to provide a desired number of reflections is to increase the slow-axis divergence angle of light entering the light-pipe to a value greater than the slow-axis divergence of light from the emitters. FIG. 3A and FIG. 3B are slow and fast-axis views respectively schematically illustrating an example of diode-laser bar 22, shaping optical assembly 14, and light-pipe 16 that can be used to provide such increased divergence. Diode-laser bar 22 includes emitters 24 as described above. In this example, shaping optical assembly 14 includes cylindrical lens 26 having parameters described above for collimating fast-axis rays 32 (see FIG. 3B). Assembly 14 additionally includes a cylindrical lens 34, here plano-convex, having positive optical power in the slow-axis only, located in the path of fast-axis collimated rays from lens 26, and having a slow-axis aperture sufficiently large that all slow-axis rays from diode-laser bar 22 are transmitted by the lens. Lens 34 focuses slow-axis rays 30 as indicated by refracted rays 30A into entrance end 16A of light-pipe 16. Rays from different emitters are depicted in different line styles for clarity of illustration.

This slow-axis focusing by lens 34 generally increases the slow-axis divergence angle α of the beam entering the light-pipe and also reduces the required width of the light-pipe. Accordingly with α generally increased, and with width A reduced, L can be correspondingly reduced for a desired $N_0$ compared with the direct coupling arrangement of FIGS. 2A and 2B. However, as will be evident from FIG. 3A, light from different emitters enters light-pipe 16 at different angles, this leads to a disadvantage that homogenizing properties of the light-pipe are correspondingly different for different lasers on the bar. This makes the arrangement sensitive to non-uniformity of emitter-to-emitter intensity distribution across the diode-laser bar. Another disadvantage is that the arrangement is sensitive to the exact value of slow-axis divergence, which can change when adjusting power level or when emitters in the diode-laser bar are ageing.

Figure 4A:
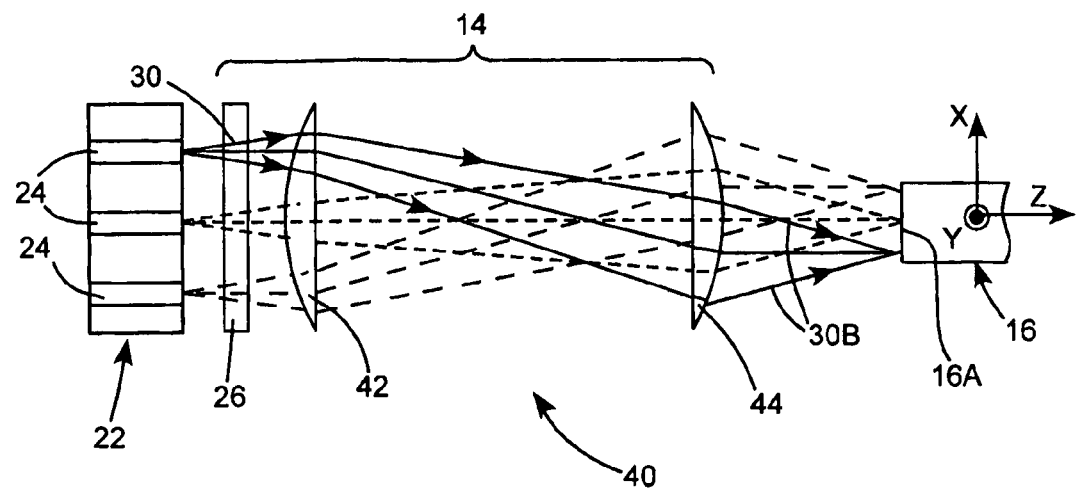
FIGS. 4A and 4B are slow-axis and fast-axis views, respectively, schematically illustrating yet another example of the shaping optical assembly of FIG. 1 wherein light is collimated in the fast-axis and focused into the light-pipe in the slow-axis by two cylindrical lenses forming a telecentric relay.
Figure 4B:
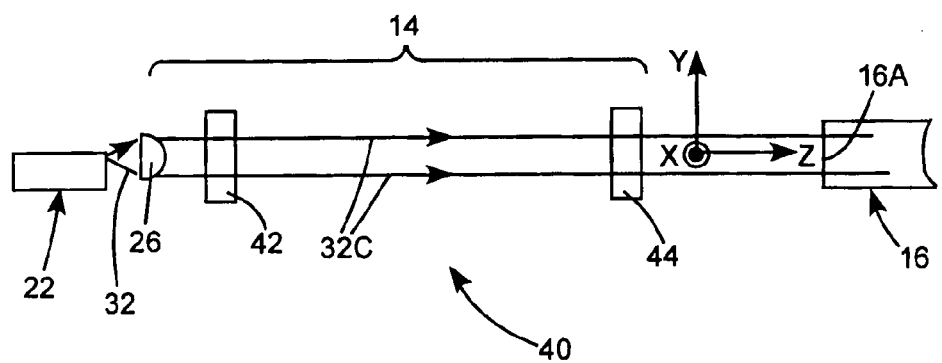

One arrangement of shaping optics 14 that avoids the disadvantages of the arrangement of FIGS. 3A and 3B is schematically illustrated in FIG. 4A and FIG. 4B, which are respectively slow-axis and fast-axis views. Here, cylindrical lens 34 in the arrangement of FIGS. 3A and 3B is replaced by a telecentric relay (telescope) 40 formed from cylindrical lenses 42 and 44, each thereof having positive power in the slow-axis only. Telescope (or relay) 40 is made by arranging (the emitting ends of) emitters 24 of diode laser 22 in a front focal plane (not explicitly shown) of lens 42, and by Z-axis spacing lenses 42 and 44 by about the sum of the focal lengths of the lenses. Telescope 40 focuses bundles of slow-axis rays from each emitter 24 in diode-laser 42 as corresponding bundles of rays 30B, into entrance end 16A of light-pipe 16.

The telecentric arrangement provides that bundles 30B from each emitter enter the light-pipe normally and have the same angular spectrum of divergence. In order to emphasize this, ray bundles from three emitters are traced in three different line styles in FIG. 4A. Because bundles 30B from each emitter enter the light-pipe normally and have the same angular spectrum, each bundle undergoes the same number of reflections in the same length of light-pipe as any other bundle. This provides for a uniform slow-axis intensity distribution regardless of variations in slow-axis intensity distribution between emitters. By making rays from each emitter in the diode-laser bar enter the light-pipe with the same divergence, the above-discussed divergence-angle variation disadvantage of the arrangement of FIGS. 3A and 3B is overcome while still providing the advantage of increased divergence α and reduced light-pipe width A. This arrangement, however, does not remedy the sensitivity to slow-axis divergence variation of emitters of the arrangement of FIGS. 3A and 3B.

Light-pipe length L required to provide a desired number $N_0$ of reflections for slow-axis rays in the light-pipe can be approximated by an equation:

$$L > (N_0/M^2) * n * (A/\alpha) \quad (3)$$

where M is the magnification of telescope 40, and other symbols are as defined above with respect to analogous equation (2). From equation (3) it follows that length of the light-pipe can be shorten by a factor of $1/M^2$ compared with the arrangement of FIGS. 2A and 2B, which, for a magnification M of about 3, shortens the value of L about 10 times. It is important to note, however, that the magnification value M is limited in practice by divergence of ray bundles 30B entering, and correspondingly exiting, light-pipe 16. As M increases, divergence increases, and can become too high for projection optical assembly 18 (see FIG. 1) to be able to project a well-defined line of light 20. Those skilled in the art will recognize that magnification M and length of the light-pipe in the inventive arrangement can be optimized using commercially ray tracing software. It is recommended that optimization cover the whole possible range of slow-axis divergence angles that may be experienced in a diode-laser bar being considered for light source 12.

One shaping optics assembly 14 in accordance with the present invention that provides the advantage of the telecentric arrangement of FIGS. 4A and 4B, while minimizing the sensitivity to actual beam divergence of light from emitters, is schematically depicted in FIG. 5A and FIG. 5B, which are respectively slow-axis and fast-axis views. In this arrangement, light from each emitter, after being collimated in the fast-axis, is reduced in divergence in the slow-axis (as indicated by rays 30R) by a cylindrical microlens array 50.

Microlens array 50 includes a number of microlenses 52 equal in number to the number of emitters 24 in diode-laser bar 22 and aligned with the emitters. The array is spaced from emitters 24 by about a focal length of the microlenses 52. Microlenses 52 have optical power in the slow-axis only and do not affect the collimation in the fast-axis.

Fast-axis collimated and slow-axis-divergence-reduced ray bundles from each emitter enter a telescopic relay 54 formed by cylindrical lens elements 56 and 58. These are spaced apart on the Z-axis by about the sum of the focal lengths to provide a telecentric arrangement. Lens 58 has a shorter focal length than lens 56 which provides for reducing overall slow-axis beam width and accordingly, the slow-axis width A of the light-pipe. Telescopic relay 54 focuses bundles of rays 30D from each emitter 24 into entrance end 16A of light-pipe 16. The reduction of the slow-axis divergence by microlens array 50 of light entering telescope 54 improves the slow-axis uniformity of light entering the light-pipe. Clearly, light enters the light-pipe with a divergence greater than the slow-axis divergence of emitters 22.

The arrangement of FIGS. 5A and 5B is particularly suitable for use with diode-laser bars having a fill-factor, for example 40%. Because of a relatively poor slow-axis beam quality (compared with fast-axis beam quality) of emitters 24 it is very difficult to reduce slow-axis divergence to a point where the light from the emitters can be described as really collimated slow-axis. Instead a minimum-obtainable value of divergence $\alpha$ will tend to a value $\alpha/K$, where K is a factor dependent, inter alia, on the available quality of microlens 52. K is dependent on the possible size of the microlens aperture. The bigger the lens aperture the longer is focal length, and the lower the effective f:number that the lens can have. The lower the fill factor, the bigger the microlens lens aperture can be. For an actual fill factor of about 30% a K value of between about 2.5 and 2.8 can be obtained, providing an apparent fill factor (after divergence reduction) of between about 90% and 95%, limited only by the clear aperture of the microlenses. The slow-axis width of the light-pipe can readily be reduced to less than one-half of the length of the diode-laser bar.

Modeling the arrangement of FIGS. 5A and 5B indicates that due to increased slow-axis uniformity of illumination at the entrance end of light-pipe 16, the light-pipe can be significantly shortened, i.e., less guiding reflections are required to provide the same uniformity at the exit end of the light-pipe than with other above-described arrangements. This arrangement is much less sensitive to variations of the slow-axis divergence of individual emitters than any other above-described arrangements. The sensitivity is reduced by the factor K, which is the reduction of slow-axis divergence provided by microlenses 52 of microlens array 50. Further the arrangement allows for much narrower light-pipes at given input divergence compared with other above-described arrangements. The narrower the light-pipe the higher is the optical quality of radiation exiting the light-pipe. This is an important consideration for the design of projection optics assembly 18 (see FIG. 1) which is required to shape the exiting light into line of light 20.

FIG. 6 is a fast-axis view schematically illustrating one preferred embodiment 60 of a line-of-light projector module in accordance with the present invention. Optical components and separation thereof are depicted approximately to scale drawing in relative terms, with the exception of the lens 26 and microlens array 50, which for clarity of illustration are depicted with exaggerated dimensions. Passage of light through the module is depicted as a single beam 61, the propagation direction of which is designated by open arrow-heads.

Light source 12, here, is a single diode-laser bar 22. Shaping optics assembly 14, including lens 26 and microlens array 50 is arranged in accordance with the assembly of FIGS. 5A and 5B and corresponding optical elements are designated by corresponding reference numerals.

Light-pipe 16 is arranged with end 16A thereof serving as an entrance end and an exit end of the light-pipe. End 16B of the light-pipe is formed into a roof prism with faces 17 and 19 thereof inclined at 45° to the Z-axis and perpendicular to each other. The direction of beam 61 is reversed, i.e., turned through 180°, and the beam transversely displaced by total internal reflection (TIR) from faces 17 and 19 in succession. This convenient arrangement of the light-pipe is permitted by the present invention as the prism does not guide light in the fast-axis, and, accordingly does not require walls to constrain light in the fast-axis, as discussed above.

Beam 61 on exiting the light-pipe is projected by projection optics assembly 18 to form line-of-light 20 as a line image in a plane 74 at a focal distance F from the last optical element (here, element 18) in assembly 18. Details of assembly 18 are depicted in FIG. 6A, which is a fast-axis view with the Z-axis represented by a dashed line. In this example, assembly 18 is arranged in the fast-axis as an inverse telephoto lens. This allows the lens to have a high magnification in the fast-axis while keeping focal distance F within acceptable limits.

Projection optics assembly 18 includes cylindrical singlet lens elements 62, 64, and 72, and a spherical (azimuthally symmetrical) cemented doublet 66 including a biconvex element 68 and a meniscus element 70. This assembly is an anamorphic assembly, as is assembly 14. Cylindrical lens 62 has zero optical power in the slow-axis and negative optical power in the fast-axis. The lens has a concave cylindrical surface 62A and a plane surface 62B. Cylindrical lens 64 has zero optical power in the fast-axis and positive optical power in the slow-axis. The lens can have either a plano or cylindrical surface 64A (plano in this example) and has a cylindrical surface 64B. Spherical doublet has a convex surface 68A, a convex surface 68B, a concave surface 70A (of element 70) matching the convex curvature of surface 68B, and a convex surface 70B. Cylindrical lens 72 has zero optical power in the slow-axis and negative optical power in the fast-axis. The lens has a convex cylindrical surface 72A and a plane surface 72B.

In one design example of module 60, lens 26 is made from S-TIH53 glass, and has a focal length of 0.91 mm each microlens 52 is made from S-TIH53 glass, has a focal length of 2.5 mm and is spaced from lens 26 by about 1.0 mm. Lens 56 is made from BK-7 glass, is convex-plano, has a radius of curvature on the cylindrical surface of 14.55 mm, has an axial thickness of 5.0 mm and is spaced from microlens array 50 by 5.0 mm. Lens 58 made from BK-7 glass, is plano-convex, has a radius of curvature on the cylindrical surface of −3.7 mm and an axial thickness of 5.0 mm, and is separated from lens 56 by 34 mm. Here, it should be noted that surface radii specified herein follow the usual sign convention, wherein a surface radius of curvature is positive if the center of curvature thereof is to the right of the surface, referred to the Z-axis.

Light-pipe 16 has a slow-axis width of 2.6 mm and a total optical length of 150.0 mm. The physical length of the light-pipe is only 75.0 mm because of the folding of the optical path by the roof prism. End 16A of the light-pipe is separated from lens 58 by 8.0 mm. Slow-axis light undergoes three reflections in traversing the light-pipe, and calculated slow-axis variations in light intensity are less than 1%. Light-pipe 16 is made from fused silica.

In projection optics assembly 18, lens 62 is made from BK7 glass, is concave-plano with surface 62A thereof having a (fast-axis) radius of −10.0 mm, has an axial thickness of 4.0 mm, and is separated from end 16A of the light-pipe by 16.0 mm. Lens 64 is made from BK7 glass, is plano-convex with surface 64B thereof having a (slow-axis) radius of −15.8 mm, has an axial thickness of 2.0 mm and is separated from lens 62 by 10.0 mm. Spherical doublet lens 66 is separated from lens 64 by 40.0 mm. Element 68 of the doublet is made from SSK4A glass and has an axial thickness of 4.0 mm. Element 70 of the doublet is made from SF8 glass and has an axial thickness of 2.0 mm. Surface 68A has a radius of 79.62 mm, surfaces 68B and 70A have a radius of −54.8 mm, and surface 70B has a radius of −360.75 mm. Lens 72 is made from BK7 glass, is convex-plano with surface 72A thereof having a (fast-axis) radius of 36.48 mm, has an axial thickness of 6.0 mm and is separated from lens 70 by 6.0 mm. Surface 72B is an aspheric surface with a conic coefficient of −1.3.

Projected line 20 has a length L of 10.0 mm, a width (height) of 50.0 µm and is located at a distance F of 100.0 mm from lens 72. Calculated uniformity of illumination in the slow-axis is 1%. The overall length $L_M$ of the module is 200.0 mm.

Figure 7:
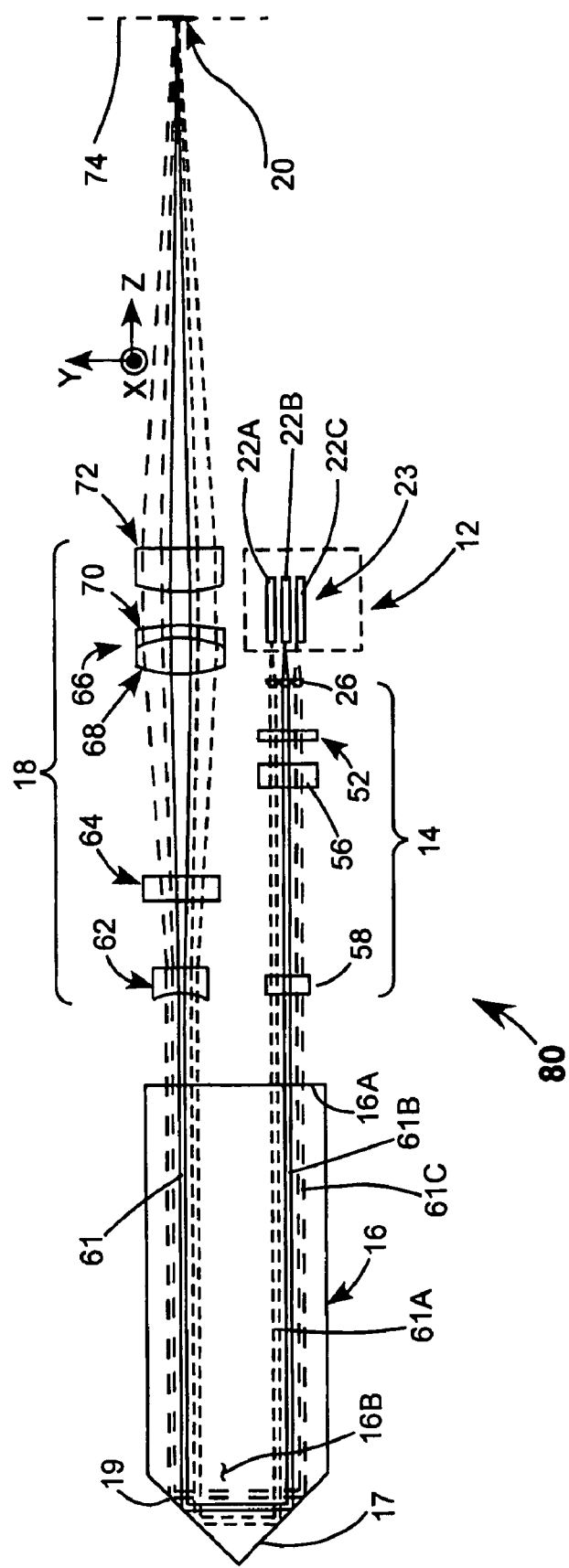
FIG. 7 is a fast-axis view schematically illustrating another preferred embodiment of a line-of-light projecting apparatus in accordance with the present invention, similar to the apparatus of FIG. 6 but including a stack of diode-laser bars

FIG. 7 is a fast-axis view schematically illustrating another preferred embodiment 80 of a line-of-light projector module in accordance with the present invention. Module 80 is similar to above described module 60 of FIGS. 6 and 6A with an exception that light source 12 includes a stack 23 of diode-laser bars designated 22A, 22B, and 22C. These diode-laser bars provide three beams 61A, 61B, and 61C respectively for illuminating light projection optics. These beams are depicted in different line styles for clarity of illustration.

Shaping optics assembly 14, here, includes three microlenses 26, one for each diode-laser bar, and a microlens array 50 having as many slow-axis microlenses as there are emitters in each bar. Projection optics assembly 18 is arranged similarly to the corresponding assembly of above-described module 60, however, it may be found necessary for elements thereof to have a larger fast-axis clear aperture to accommodate additional beams. While three diode bars providing three beams are depicted in FIG. 7, clearly more or less diode-laser bars providing correspondingly more or less beams may be included in stack 23.

However many diode-laser bars are included in stack 23, it is preferable to have emitters of these bars spaced-apart as closely as possible in the fast-axis. This is practically limited at least by the thickness of the substrate on which the emitters are grown. Optical methods and apparatus for creating an apparent close spacing of emitters of diode-laser bars are known in the art. Several embodiments of such apparatus are described in detail in U.S. patent application Ser. No. 2004/0252744, assigned to the assignee of the present invention, and the complete disclosure of which is hereby incorporated by reference.

The present invention is described above in terms of a preferred and other embodiments. The invention is not limited, however, to the embodiments described and depicted. Rather, the invention is limited only by the claims appended hereto.

What is claimed is:

1. Apparatus for projecting a line of light, comprising:
   a light-pipe;
   at least one diode-laser bar including a plurality of spaced-apart emitters for emitting light, the light from said emitters of said diode-laser bar being emitted in a fast-axis and a slow-axis perpendicular to each other and perpendicular to the general direction of emission, with the fast-axis having a fast axis divergence and the slow-axis having a slow-axis divergence wherein said diode-laser bar has a length in the slow-axis and said light-pipe has a slow-axis width less than the length of said diode-laser bar;
   a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis said first optical arrangement includes a first cylindrical lens followed by a second cylindrical lens, said first cylindrical lens being arranged to collimate light emitted by said diode-laser bar in the fast-axis and said second cylindrical lens being arranged to focus said light in the slow-axis into said light-pipe said second cylindrical lens has a slow-axis optical power selected such that the light entering the light-pipe has a slow-axis divergence greater than the slow-axis divergence of light emitted from said diode-laser bar; and
   a second optical arrangement arranged to receive light exiting said light-pipe and focus said light to form the line of light.

2. The apparatus of claim 1, wherein the line of light has a length in the slow-axis and a width in the fast-axis.

3. The apparatus of claim 2, wherein the line of light has a length:width ratio between about 100:1 and 500:1.

4. The apparatus of claim 1, wherein the light emitted by said diode-laser bar has a fast-axis divergence and a slow-axis divergence and said first optical arrangement includes a cylindrical lens arranged to collimate light emitted by said diode-laser bar in the fast-axis, and light emitted from said diode-laser bar in the slow-axis is transmitted by the cylindrical lens with divergence thereof unchanged and enters said light-pipe with said first divergence.

5. The apparatus of claim 1, wherein the light emitted by said diode-laser bar has a fast-axis divergence and a slow-axis divergence and said first optical arrangement includes first, second, and third cylindrical lenses, said first cylindrical lens being arranged to collimate light emitted by said diode-laser bar in the fast-axis and said second and third cylindrical lenses being arranged to focus said fast-axis collimated light in the slow-axis into said light-pipe.

6. The apparatus of claim 1, wherein the light emitted by said diode-laser bar has a fast-axis divergence and a slow-axis divergence and said first optical arrangement includes a first cylindrical lens, a lens array including a plurality of second cylindrical lenses, and third and fourth cylindrical lenses, said first cylindrical lens being arranged to collimate light emitted by said diode-laser bar in the fast-axis, each of said second cylindrical lenses being arranged to reduce the divergence of said fast-axis collimated light of a corresponding emitter of said diode-laser bar in the slow-axis and said second and third cylindrical lenses being arranged to focus said fast-axis collimated, slow-axis-divergence-reduced light in the slow-axis into said light-pipe.

7. The apparatus of claim 1, wherein said second optical arrangement is in the form of an inverse telephoto lens in the slow-axis.

8. The apparatus of claim 1, wherein said light-pipe has first and second ends said second end having first and second faces at an angle to each other, and wherein said light entering said light-pipe at said first end thereof, propagates through said light-pipe to said second end thereof, is reflected through 180 degrees by successive reflections from said first and second faces, and exits said light-pipe at said first end thereof.

9. Apparatus for projecting a line of light, comprising:
at least one diode-laser bar having a length and including a plurality of spaced-apart emitters spaced apart in the length direction, for emitting light, the light from said emitters of said diode-laser bar being emitted in a fast-axis and a slow-axis perpendicular to each other and perpendicular to the general direction of emission, wherein the light from said emitters of said diode-laser bar is emitted as a diverging beam having a fast-axis divergence and a slow-axis divergence;
a light-pipe, said light having a width in said slow-axis less than the length of said diode-laser bar;
a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis, wherein said first optical arrangement is further arranged such that light entering said light-pipe has a slow-axis divergence greater than the slow-axis divergence of light emitted by said emitters of said diode-laser bar and wherein said first optical arrangement is a telecentric arrangement; and
a second optical arrangement arranged to receive light exiting said light-pipe and focus said light to form the line-of-light.

10. The apparatus of claim 9, wherein said light-pipe has a slow-axis width less than or equal to about one-half the width of the diode-laser bar the length of said diode-laser bar.

11. The apparatus of claim 9, wherein said diode-laser bar has a length of about 10.0 mm and said light-pipe has a slow-axis width of about 2.6 mm.

12. The apparatus of claim 9, wherein light from each of the emitters in said diode-laser bar enters said-light-pipe normally and with the same angular spectrum of divergence.

13. Apparatus for projecting a line of light, comprising:
at least one diode-laser bar having a length and including a plurality of spaced-apart emitters spaced apart in the length direction, for emitting light, the light from said emitters of said diode-laser bar being emitted as a diverging beam in a fast-axis and a slow-axis perpendicular to each other and perpendicular to the general direction of emission;
a light-pipe;
a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis, and said first optical arrangement being also arranged such that light entering said light-pipe has a slow-axis divergence greater than the slow-axis divergence of light emitted by said emitters; and
a second optical arrangement arranged to receive light exiting said light-pipe and focus said light to form the line of light.

14. The apparatus of claim 13, wherein said first optical arrangement is further arranged such that light from each of the emitters in said diode-laser bar enters said-light-pipe normally and with the same angular spectrum of divergence.

15. Apparatus for projecting a line of light, comprising:
at least one diode-laser bar for emitting the light the light from said diode-laser bar being emitted in a fast-axis and a slow-axis perpendicular to each other and perpendicular to the general direction of emission, said diode-laser bar having a length in the slow-axis;
a light-pipe having a slow-axis width less than the length of said diode-laser bar;
a first optical arrangement including a slow-axis telecentric relay for directing the light emitted by said diode-laser bar into said light-pipe, said first optical arrangement and said light-pipe being configured and arranged such that the light propagates through said light-pipe substantially unguided thereby in the fast-axis and guided by said light-pipe in the slow-axis; and
a second optical arrangement including an inverse telephoto lens arranged to receive light exiting said light-pipe and focus said light to form the line of light.

16. The apparatus of claim 15, wherein light enters and exits said light-pipe at the same end thereof.

17. Apparatus for projecting a line of light, comprising: a light-pipe;
at least one diode-laser bar including a plurality of spaced-apart emitters for emitting light, the light from said emitters of said diode-laser bar being emitted in a fast-axis and a slow-axis perpendicular to each other and perpendicular to the general direction of emission, wherein the light emitted by said diode-laser bar has a fast-axis divergence and a slow-axis divergence; a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis and said first optical arrangement includes first, second, and third cylindrical lenses, said first cylindrical lens being arranged to collimate light emitted by said diode-laser bar in the fast-axis and said second and third cylindrical lenses being arranged to focus said fast-axis collimated light in the slow-axis into said light-pipe; and a second optical arrangement arranged to receive light exiting said light-pipe and focus said light to form the line of light.

18. The apparatus of claim 17, wherein said first optical arrangement is a telecentric arrangement in the slow-axis, and light from each emitter of the diode laser bar enters said light-pipe normally with about the same angular spectrum.

19. The apparatus of claim 18, wherein said first, second, and third cylindrical lenses, have respectively first, second, and third focal lengths, and wherein said second lens is spaced apart from said diode-laser bar by about said second focal length, and said second and third lenses are spaced apart by about the sum of said second and third focal lengths.

20. The apparatus of claim 19, wherein said light-pipe has an entrance end spaced apart from said third lens by about said third focal length.

21. The apparatus of claim 19, wherein said first lens is spaced apart from said diode-laser bar by about said first focal length.

22. Apparatus for projecting a line of light, comprising:
a light-pipe;
at least one diode-laser bar including a plurality of spaced-apart emitters for emitting light, the light from said emitters of said diode-laser bar being emitted in a fast-axis and a slow-axis perpendicular to each other and perpendicular to the general direction of emission, wherein the light emitted by said diode-laser bar has a fast-axis divergence and a slow-axis divergence;

a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis, said first optical arrangement includes a first cylindrical lens, a lens array including a plurality of second cylindrical lenses, and third and fourth cylindrical lenses, said first cylindrical lens being arranged to collimate light emitted by said diode-laser bar in the fast-axis, each of said second cylindrical lenses being arranged to reduce the divergence of said fast-axis collimated light of a corresponding emitter of said diode-laser bar in the slow-axis and said second and third cylindrical lenses being arranged to focus said fast-axis collimated, slow-axis-divergence-reduced light in the slow-axis into said light-pipe; and a second optical arrangement arranged to receive light exiting said light-pipe and focus said light to form the line of light.

23. The apparatus of claim 22, wherein said first optical arrangement is a telecentric arrangement in the slow-axis, and light from each emitter of the diode laser bar enters said light-pipe normally with about the same angular spectrum.

24. The apparatus of claim 23, wherein said fourth cylindrical lens has a focal length less than the focal length of said third lens, and said third and fourth cylindrical lenses are spaced-apart by about the sum of said focal lengths.

25. The apparatus of claim 24, wherein said diode-laser bar has a length in the slow-axis and said light-pipe has a slow-axis width less than the length of said diode-laser bar.

26. Apparatus for projecting a line of light, comprising:

a light-pipe;

at least one diode-laser bar including a plurality of spaced-apart emitters for emitting light, the light from said emitters of said diode-laser bar being emitted in a fast-axis and a slow-axis perpendicular to each other and perpendicular to the general direction of emission;

a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis; and a second optical arrangement arranged to receive light exiting said light-pipe and focus said light to form the line of light and wherein said second optical arrangement is in the form of an inverse telephoto lens in the slow-axis.

27. Apparatus for projecting a line of light, comprising:

a light-pipe;

at least one diode-laser bar including a plurality of spaced-apart emitters for emitting light, the light from said emitters of said diode-laser bar being emitted in a fast-axis and a slow-axis perpendicular to each other and perpendicular to the general direction of emission;

a first optical arrangement for directing the light emitted by the emitters of said diode-laser bar into said light-pipe, said first optical arrangement and said light-pipe being arranged such that the light propagates through said light-pipe substantially unguided thereby in the fast-axis and guided by said light-pipe in the slow-axis; and a second optical arrangement arranged to receive light exiting said light-pipe and focus said light to form the line of light and wherein said light-pipe has first and second ends said second end having first and second faces at an angle to each other, and wherein said light entering said light-pipe at said first end thereof, propagates through said light-pipe to said second end thereof, is reflected through 180 degrees by successive reflections from said first and second faces, and exits said light-pipe at said first end thereof.

* * * * *